(12) United States Patent
Bernds et al.

(10) Patent No.: US 7,678,857 B2
(45) Date of Patent: Mar. 16, 2010

(54) POLYMER MIXTURES FOR PRINTED POLYMER ELECTRONIC CIRCUITS

(75) Inventors: Adolf Bernds, Baiersdorf (DE); Wolfgang Clemens, Puschendorf (DE); Alexander Friedrich Knobloch, Erlangen (DE); Andreas Ullmann, Zirndorf (DE)

(73) Assignee: PolyIC GmbH & Co. KG, Furth (DE)

( * ) Notice: Subject to any disclaimer, the term of this patent is extended or adjusted under 35 U.S.C. 154(b) by 1059 days.

(21) Appl. No.: 10/569,233

(22) PCT Filed: Aug. 31, 2004

(86) PCT No.: PCT/DE2004/001930

§ 371 (c)(1),
(2), (4) Date: Feb. 22, 2006

(87) PCT Pub. No.: WO2005/024895

PCT Pub. Date: Mar. 17, 2005

(65) Prior Publication Data

US 2007/0017401 A1    Jan. 25, 2007

(30) Foreign Application Priority Data

Sep. 3, 2003  (DE) ................ 103 40 643

(51) Int. Cl.
  *C08L 37/00* (2006.01)
(52) U.S. Cl. .................. 524/517; 524/521
(58) Field of Classification Search ............ 524/517, 524/521
See application file for complete search history.

(56) References Cited

U.S. PATENT DOCUMENTS

| | | |
|---|---|---|
| 3,512,052 A | 12/1970 | MacIver et al. |
| 3,769,096 A | 10/1973 | Ashkin |
| 3,955,098 A | 5/1976 | Kawamoto |
| 3,999,122 A | 12/1976 | Winstel et al. |
| 4,246,298 A | 1/1981 | Guarnery |
| 4,302,648 A | 11/1981 | Sado et al. |
| 4,340,057 A | 7/1982 | Bloch |
| 4,442,019 A | 4/1984 | Marks |
| 4,554,229 A | 11/1985 | Small |
| 4,865,197 A | 9/1989 | Craig |
| 4,926,052 A | 5/1990 | Hatayama |
| 4,937,119 A | 6/1990 | Nickles et al. |
| 5,075,816 A | 12/1991 | Stormbom |
| 5,173,835 A | 12/1992 | Cornett et al. |
| 5,206,525 A | 4/1993 | Yamamoto et al. |
| 5,259,926 A | 11/1993 | Kuwabara et al. |
| 5,321,240 A | 6/1994 | Takihira |
| 5,347,144 A | 9/1994 | Garnier et al. |
| 5,364,735 A | 11/1994 | Akamatsu |
| 5,395,504 A | 3/1995 | Hoffman et al. |
| 5,480,839 A | 1/1996 | Ezawa et al. |
| 5,486,851 A | 1/1996 | Gehner et al. |
| 5,502,396 A | 3/1996 | Desarzens |
| 5,569,879 A | 10/1996 | Gloton |
| 5,574,291 A | 11/1996 | Dodabalapur et al. |
| 5,578,513 A | 11/1996 | Maegawa |
| 5,580,794 A | 12/1996 | Allen |
| 5,625,199 A | 4/1997 | Baumbach et al. |
| 5,629,530 A | 5/1997 | Brown et al. |
| 5,630,986 A | 5/1997 | Charlton |
| 5,652,645 A | 7/1997 | Jain |
| 5,691,089 A | 11/1997 | Smayling |
| 5,693,956 A | 12/1997 | Shi |
| 5,705,826 A | 1/1998 | Aratani et al. |
| 5,729,428 A | 3/1998 | Sakata et al. |
| 5,854,139 A | 12/1998 | Kondo et al. |
| 5,869,972 A | 2/1999 | Birch et al. |
| 5,883,397 A | 3/1999 | Isoda et al. |
| 5,892,244 A | 4/1999 | Tanaka et al. |
| 5,546,889 A | 8/1999 | Wakita et al. |
| 5,946,551 A | 8/1999 | Dimitrakopoulos |
| 5,967,048 A | 10/1999 | Fromson et al. |
| 5,970,318 A | 10/1999 | Choi et al. |
| 5,973,598 A | 10/1999 | Beigel |
| 5,994,773 A | 10/1999 | Hirakawa |
| 6,335,539 B1 | 10/1999 | Dimitrakopoulos et al. |
| 5,997,817 A | 12/1999 | Crismore et al. |
| 5,998,805 A | 12/1999 | Shi et al. |
| 6,036,919 A | 3/2000 | Thym et al. |
| 6,045,977 A | 4/2000 | Chandross et al. |

(Continued)

FOREIGN PATENT DOCUMENTS

DE    33 38 597    5/1985

(Continued)

OTHER PUBLICATIONS

Wang, H.L. et al., "Conducting polymer blends: polythiophene and polypyrrole blends with polystyrene and poly (bisphenol A carbonate)", Macromolecules, vol. 23, 1990, pp. 1053-1059.

Wang, Yading, et al, "Electrically conductive semiinterpenetrating polymer networks of poly(3-octylthiophene", Macromolecules, vol. 25, 1992, pp. 3284-3290.

Brabec, C.J. et al., "Photovoltaic properties of conjugated polymer/ methanofullerene composites embedded in a polystyrene matrix", Journal of Applied Physics, vol. 85, No. 9, 1999, pp. 6866-6872.

Brabec, et al., "Photoinduced FT-IR spectroscopy and CW-photocurrent measurements of conjugated polymers and fullerenes blended into a conventional polymer matrix", Solar Energy Materials and Solar Cells, vol. 61, 2000, pp. 19-33.

(Continued)

*Primary Examiner*—Bernard Lipman
(74) *Attorney, Agent, or Firm*—Carella, Byrne et al.; Elliot M. Olstein; William Squire

(57) ABSTRACT

In order to increase the viscosity of semiconductive polymers in solution, they are mixed with non-semiconductive polymers.

20 Claims, 3 Drawing Sheets

U.S. PATENT DOCUMENTS

| | | | |
|---|---|---|---|
| 6,060,338 A | 5/2000 | Tanaka et al. |
| 6,072,716 A | 6/2000 | Jacobsen et al. |
| 6,083,104 A | 7/2000 | Choi |
| 6,087,196 A | 7/2000 | Sturm et al. |
| 6,133,835 A | 10/2000 | DeLeeuw et al. |
| 6,150,668 A | 11/2000 | Bao |
| 6,180,956 B1 | 1/2001 | Chondroudis |
| 6,197,663 B1 | 3/2001 | Chandross |
| 6,207,472 B1 | 3/2001 | Calligari et al. |
| 6,215,130 B1 | 4/2001 | Dodabalapur |
| 6,221,553 B1 | 4/2001 | Wolk |
| 6,251,513 B1 | 6/2001 | Rector |
| 6,284,562 B1 | 9/2001 | Batlogg et al. |
| 6,300,141 B1 | 10/2001 | Segal et al. |
| 6,321,571 B1 | 11/2001 | Themont et al. |
| 6,322,736 B1 | 11/2001 | Bao |
| 6,329,226 B1 | 12/2001 | Jones |
| 6,330,464 B1 | 12/2001 | Colvin |
| 6,340,822 B1 | 1/2002 | Brown et al. |
| 6,344,662 B1 | 2/2002 | Dimitrakopoulos et al. |
| 6,362,509 B1 | 3/2002 | Hart |
| 6,384,804 B1 | 5/2002 | Dodabalapur et al. |
| 6,403,396 B1 | 6/2002 | Gudesen et al. |
| 6,429,450 B1 | 8/2002 | Mutsaers et al. |
| 6,498,114 B1 | 12/2002 | Amundson et al. |
| 6,518,949 B2 | 2/2003 | Drazic |
| 6,521,109 B1 | 2/2003 | Bartic et al. |
| 6,548,875 B2 | 4/2003 | Nishiyama |
| 6,555,840 B1 | 4/2003 | Hudson |
| 6,593,690 B1 | 7/2003 | McCormick |
| 6,603,139 B1 | 8/2003 | Tessler |
| 6,621,098 B1 | 9/2003 | Jackson |
| 6,517,955 B1 | 2/2005 | Jacobsen et al. |
| 6,852,583 B2 | 2/2005 | Bernds et al. |
| 6,903,958 B2 | 6/2005 | Bernds et al. |
| 6,960,489 B2 | 11/2005 | Bernds et al. |
| 2002/0018911 A1 | 2/2002 | Bernius et al. |
| 2002/0022284 A1 | 2/2002 | Heeger |
| 2002/0025391 A1 | 2/2002 | Angelopoulos |
| 2002/0053320 A1 | 5/2002 | Duthaler |
| 2002/0056839 A1 | 5/2002 | Joo et al. |
| 2002/0068392 A1 | 6/2002 | Lee et al. |
| 2002/0130042 A1 | 9/2002 | Stiene |
| 2002/0170897 A1 | 11/2002 | Hall |
| 2002/0195644 A1 | 12/2002 | Dodabalapur et al. |
| 2003/0059987 A1 | 3/2003 | Sirringhaus et al. |
| 2003/0112576 A1 | 6/2003 | Brewer et al. |
| 2004/0002176 A1 | 1/2004 | Xu |
| 2004/0013982 A1 | 1/2004 | Jacobson et al. |
| 2004/0026689 A1 | 2/2004 | Bernds et al. |
| 2004/0084670 A1 | 5/2004 | Tripsas et al. |
| 2004/0211329 A1 | 10/2004 | Funahata et al. |
| 2005/0196969 A1* | 9/2005 | Gunner et al. ............... 438/725 |

FOREIGN PATENT DOCUMENTS

| | | | |
|---|---|---|---|
| DE | 692 32 740 T2 | 4/1993 |
| DE | 424 38 32 | 6/1994 |
| DE | 198 52 312 | 5/1999 |
| DE | 198 16 860 | 11/1999 |
| DE | 199 18 193 | 11/1999 |
| DE | 198 51 703 | 5/2000 |
| DE | 100 06 257 | 9/2000 |
| DE | 199 21 024 | 11/2000 |
| DE | 199 33 757 | 1/2001 |
| DE | 695 19 782 | 1/2001 |
| DE | 199 35 527 | 2/2001 |
| DE | 199 37 262 | 3/2001 |
| DE | 100 12 204 | 9/2001 |
| DE | 100 33 112 | 1/2002 |
| DE | 100 43 204 | 4/2002 |
| DE | 100 45 192 | 4/2002 |
| DE | 100 47 171 | 4/2002 |
| DE | 100 58 559 | 5/2002 |
| DE | 100 61 297 | 6/2002 |
| DE | 101 17 663 | 10/2002 |
| DE | 101 20 687 | 10/2002 |
| DE | 101 20 686 | 11/2002 |
| DE | 102 19 905 | 12/2003 |
| EP | 0 108 650 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 418 504 | 3/1991 |
| EP | 0 442 123 | 8/1991 |
| EP | 0 460 242 | 12/1991 |
| EP | 0 501 456 A2 | 9/1992 |
| EP | 0 501 456 A3 | 9/1992 |
| EP | 0 511 807 | 11/1992 |
| EP | 0 528 662 | 2/1993 |
| EP | 0 603 939 A2 | 6/1994 |
| EP | 0 685 985 | 12/1995 |
| EP | 0 716 458 | 6/1996 |
| EP | 0 785 578 A2 | 7/1997 |
| EP | 0 785 578 A3 | 7/1997 |
| EP | 0 786 820 | 7/1997 |
| EP | 0 615 256 | 9/1998 |
| EP | 0 690 457 | 12/1999 |
| EP | 0 962 984 | 12/1999 |
| EP | 0 966 182 | 12/1999 |
| EP | 0966 182 | 12/1999 |
| EP | 0 979 715 | 2/2000 |
| EP | 0 981 165 | 2/2000 |
| EP | 0 989 614 A2 | 3/2000 |
| EP | 1 048 912 | 11/2000 |
| EP | 1 052 594 | 11/2000 |
| EP | 1 065 725 A2 | 1/2001 |
| EP | 1 065 725 A3 | 1/2001 |
| EP | 1 083 775 | 3/2001 |
| EP | 1 102 335 A2 | 5/2001 |
| EP | 1 103 916 | 5/2001 |
| EP | 1 104 035 A2 | 5/2001 |
| EP | 1 113 502 | 7/2001 |
| EP | 1 134 694 | 9/2001 |
| EP | 1 224 999 | 7/2002 |
| EP | 1 237 207 | 9/2002 |
| EP | 1 318 084 | 6/2003 |
| FR | 2793089 | 11/2000 |
| GB | 723598 | 2/1955 |
| GB | 2 058 462 | 4/1981 |
| GR | 2001P20024 | 8/2000 |
| GR | 2001P03239 | 1/2001 |
| JP | 54069392 | 6/1979 |
| JP | 60117769 | 6/1985 |
| JP | 61001060 | 1/1986 |
| JP | 61167854 | 7/1986 |
| JP | 62065472 A | 3/1987 |
| JP | 362065477 A | 3/1987 |
| JP | 01169942 | 7/1989 |
| JP | 2969184 | 12/1991 |
| JP | 03290976 A | 12/1991 |
| JP | 05259434 | 10/1993 |
| JP | 05347422 | 12/1993 |
| JP | 08197788 | 8/1995 |
| JP | 09083040 | 3/1997 |
| JP | 09320760 | 12/1997 |
| JP | 10026934 | 1/1998 |
| JP | 2001085272 | 3/2001 |
| JP | 2006013492 A * | 1/2006 |
| WO | WO 93/16491 | 8/1993 |
| WO | WO 94/17556 | 8/1994 |
| WO | WO 95/06240 | 3/1995 |
| WO | WO 95/31831 | 11/1995 |

| | | |
|---|---|---|
| WO | WO 96/02924 | 2/1996 |
| WO | WO 96/19792 | 6/1996 |
| WO | WO 97/12349 | 4/1997 |
| WO | WO 97/18944 | 5/1997 |
| WO | WO 98/18156 | 4/1998 |
| WO | WO 98/18186 | 4/1998 |
| WO | WO 98/40930 | 9/1998 |
| WO | WO 99/07189 | 2/1999 |
| WO | WO 99/10929 | 3/1999 |
| WO | WO 99/10939 | 3/1999 |
| WO | WO 99/21233 | 4/1999 |
| WO | WO 99/30432 | 6/1999 |
| WO | WO 99/39373 | 8/1999 |
| WO | WO 99/40631 | 8/1999 |
| WO | WO 99/53371 | 10/1999 |
| WO | WO 99/54936 | 10/1999 |
| WO | WO 99/66540 | 12/1999 |
| WO | WO 00/33063 | 6/2000 |
| WO | WO 00/36666 | 6/2000 |
| WO | WO 00/79617 | 12/2000 |
| WO | WO 01/03126 | 1/2001 |
| WO | WO 01/06442 | 1/2001 |
| WO | WO 01/08241 | 2/2001 |
| WO | WO 01/15233 | 3/2001 |
| WO | WO 01/17029 | 3/2001 |
| WO | WO 01/17041 | 3/2001 |
| WO | WO 01/27998 | 4/2001 |
| WO | WO 01/46987 | 6/2001 |
| WO | WO 01/47044 A2 | 6/2001 |
| WO | WO 01/47044 A3 | 6/2001 |
| WO | WO 01/47045 | 6/2001 |
| WO | WO 01/73109 A2 | 10/2001 |
| WO | WO 01/73109 A3 | 10/2001 |
| WO | WO 02/05360 | 1/2002 |
| WO | WO 02/05361 | 1/2002 |
| WO | WO 02/15264 | 2/2002 |
| WO | WO 02/19443 | 3/2002 |
| WO | WO 02/29912 | 4/2002 |
| WO | WO 02/43071 | 5/2002 |
| WO | WO 02/47183 | 6/2002 |
| WO | WO 02/065557 A1 | 8/2002 |
| WO | WO 02/071139 | 9/2002 |
| WO | WO 02/071505 | 9/2002 |
| WO | WO 02/076924 | 10/2002 |
| WO | WO 02//091495 | 11/2002 |
| WO | WO 02/091495 | 11/2002 |
| WO | WO 02/095805 A2 | 11/2002 |
| WO | WO 02/095805 A3 | 11/2002 |
| WO | WO 02/099907 | 12/2002 |
| WO | WO 02/099908 | 12/2002 |
| WO | WO 03/036686 | 5/2003 |
| WO | WO 03/046922 | 6/2003 |
| WO | WO 03/067680 | 8/2003 |
| WO | WO 03/069552 | 8/2003 |
| WO | WO 03/081671 | 10/2003 |
| WO | WO 03/095175 | 11/2003 |
| WO | WO 2004/032257 | 4/2004 |
| WO | WO 2004/042837 | 5/2004 |
| WO | WO 2004/042837 A2 | 5/2004 |
| WO | WO 2004/042837 A3 | 5/2004 |
| WO | WO 2004/007194 A2 | 6/2004 |
| WO | WO 2004/007194 A3 | 6/2004 |
| WO | WO 2004/047144 A2 | 6/2004 |
| WO | WO 2004/047144 A3 | 6/2004 |
| WO | WO 2004/083859 | 9/2004 |

OTHER PUBLICATIONS

Shaheen, S.E. et al., "Low band gap polymeric photovoltaic devices", Synthetic Metals, vol. 121, 2001, pp. 1583-1584.

Nalwa, H.S., "Organic Conductive Molecules and Polymers", vol. 2, 1997, pp. 534-535.

Speakman, S.P. et al., High performance organic semiconducting thin films: Ink Jet printed polythiophene [rr-P3HT], Organic Electronics 2 (2), 2001, pp. 65-73.

Garbassi F. et al, "Bulk Modifications", Polymer Surfaces, John Wiley & Sons, 1998, pp. 289-300.

Angelopoulos M et al., "In-Situ Radiation Induced Doping", Mol. Crystl. Liq. Cryst., 1990, vol. 189, pp. 221-225.

Assadi A, et al:, Field-Effect Mobility of Poly (3-Hexylthiophene) Dept. of Physics and Measurement Technology, Received Mar. 3, 1988; accepted for Publication May 17, 1988.

Bao, Z. et al., "High-Performance Plastic Transistors Fabricatecd by Printing Techniques", Chem. Mater vol. 9, No. 6, 1997, pp. 1299-1301.

Bao, Z. et al. "Organic and Polymeric Materials for the Fabrications of Thin Film Field-Effect Transistors", paper presented at the meeting of American Chemical Society, Division of Polymer Chemistry, XX, XX, vol. 39, No. 1, Mar. 29, 1998.

Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.

Brabec, C.J. et al., "Photovoltaic properties of a conjugated polymer/ methanofullerene composites embedded in a polystyrene matrix", Journal of Applied Physics, vol. 85, No. 9, 1999, pp. 6866-6872.

Braun D., et al, "Visible light emission from semiconducting polymer diodes", American Institute of Physics, Applied Physics Letters 58, May 6, 1991, pp. 1982-1984.

Brown, A.R. et al., "Field-effect transistors made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.

Chen, X.L. et al., "Morphological and Transistor Studies of Organic Molecular Semiconductors with Anisotropic Electrical Characteristics", American Chemical Society, 2001, Chem. Mater. 2001, 13, 1341-1348.

Clemens, W. et al., "Vom Organischen Transistor Zum Plastik-Chip," Physik Journal, V. 2, 2003, pp. 31-36.

Collet J. et al:, 'Low Voltage, 30 NM Channel Length, Organic Transistors With A Self-Assembled Monolayer As Gate Insulating Films:, Applied Physics Letters, American Institute of Physics. New York, US, Bd 76, Nr. 14, Apr. 3, 2000, Seiten 1941-1943, XP000950589, ISSN:0003-6951, das ganze Dokument.

Crone, B. et al, "Large-scale complementary Integrated circuits based on Organic transistors", Nature, vol. 403, Feb. 3, 2000, pp. 521.

Dai, L. et al, Photochemical Generation of Conducting Pattersn in Polybutadiene Films:, Macromolecules, vol. 29, No. 1, 1996, pp. 282-287, XP 001042019, the whole document.

Dai, L. et al., "Conjugation of Polydienes by Oxidants Other Than Iodine", Elsevier Science S.A., Synthetic Metals 86 (1997) 1893-1894.

Dai, L. et al., "$I_2$-Doping" of 1,4-Polydienes*, Elsevier Science S.A., Synthetic Metals 69 (1995), pp. 563-566.

De Leeuw D.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.

Dodabalapur, A. et al., Organic smart pixels, American Institute of Physics, Applied Physics Letters, vol. 73, No. 2, Jul. 13, 1998, pp. 142-144.

Drury et al., "Low-Cost All-Polymer Integrated Circuits", American Institute of Physics, Applied Physics Letters, 1998, vol. 73, No. 1, pp. 108-110, Jul. 6, 1998.

Ficker, J. et al., "Dynamic and Lifetime Measurements of Polymer OFETS and Integrated Plastic Circuits," Proc. of SPIE, v. 466, 2001, pp. 95-102.

Fix, W. et al., "Fast Polymer Integrated Circuits Based on a Polyfluorene Derivative", ESSDERC 2002, 2002, pp. 527-529.

Fix, W., et al., "Fast polymer integrated circuits", American Institute of Physics, Applied Physics Letters, vol. 81, No. 89, Aug. 2002, pp. 1735-1737.

Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zeile 58-Seite 34, linke Spalte, Zeile 24; Abbildung 5.

Fraunhofer Magazin- Polytronic Chips Von der Rolle, Apr. 2001, pp. 8-13.

Garbassi F., et al., "Bulk Modifications", Polymer Surfaces, John Wiley & Sons, 1998, pp. 289-300.

Garnier F et al:, "Vertical Devices Architecture By Molding Of Organic-Based Thin Film Transistor", Applied Physics Letters, American Institute Of Physics. XP000784120, issn: 0003-6951 abbildung 2.

Garnier, F. et al, "All-Polymer Field-Effect Transistor Realized by Printing Techniques", Science, American Association for the Advancement of Science, US, vol. 265, Sep. 16, 1994, pp. 1684-1686.

Garnier et al., "Conjugated Polymers and Oligomers as Active Material For Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Goncalves_Conto, Sylvie, et al., "Interface Morphology in Organic Light-Emitting Diodes", Advanced Materials 1999, vol. 11, No. 2, pp. 112-115.

Gosain, D.P., "Excimer laser crystallized poly-Si TFT's on plastic substrates", Second International Symposium on Laser Precision Microfabrication, May 16-18, 2001, Singapore, vol. 4426, pp. 394-400.

Halls, J.J. M., et al., "Efficient photodiodes from interpenetrating polymer networks", Nature, vol. 376, Aug. 10, 1995, pp. 498-500.

Harsanyi G. et al, "Polytronics for biogtronics:unique possibilities of polymers in biosensors and BioMEMS", IEEE Polytronic 2002 Conference, Jun. 23, 2002, pp. 211-215.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Hergel, H. J.: "Pld-Programmiertechnologien", Elektronik, Franzis Verlag GMBH. Munchen, DE, Bd 41, Nr. 5, Mar. 3, 1992, Seiten 44-46, XP000293121, ISSN: 0013-5658, Abbildungen 1-3.

Hwang J D et al:, "A Vertical Submicron Slc thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.

IBM Technical Disclosure Bulletin, "Short-Channel Field-Effect Transistor", IBM Corp., New York, US, Bd. 32, Nr. 3A, Aug. 1, 1989, Seiten 77-78, XP000049357, ISSN:0018-8689, das ganze Dokument.

Kawase, T., et al., "Inkjet Printed Via-Hole Interconnections and Resistors for All-Polymer Transistor Circuits", Advanced Materials 2001, 13, No. 21, Nov. 2, 2001, pp. 1601-1605.

Klauk, H. et al., "Fast Organic Thin Film Transistor Circuits", IEEE Electron Device Letters, vol. 20, No. 6, pp. 289-291.

Klauk, H. et al., "Pentacene Thin Film Transistors and Inverter Circuits", 1997 International Exectron Devices Meeting Technical Digest, pp. 539-542, Dec. 1997.

Knobloch, A. et al., "Printed Polymer Transistors", Proc. Polytronic, v. 84, 2001, pp. 84-89.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Koezuka, H. et al., "Macromolecular Electronic Device", Mol. Cryst. Liq. Cryst. 1994, vol. 2555, pp. 221-230.

Kuhlmann et al., "Terabytes in Plastikfolie", Organische Massenspeicher vor der Serienproduktion.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Lidzey, D. G. et al., "Photoprocessed and Micropatterned Conjugated Polymer LEDs", Synthetic Metals, V. 82, 1996, pp. 141-148.

Lowe, J. et al., "Poly (3—(2—Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.

Lu, Wen et al., "Use of Ionic Liquids for π-Conjugated Polymer Electrochemical Devices", Science, vol. 297, 2002, pp. 983-987.

Lucent Technologies, "Innovation marks significant milestone in the development of electronic paper", Cambridge, MA and Murray Hill, NJ, Nov. 20, 2000. XP-002209726.

Manuelli, Alessandro et al., "Applicability of Coating Techniques for the Production of Organic Field Effect Transistors", IEEE Polytronic 2002 Conference, 2002, pp. 201-204.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Nalwa, H.S., "Organic Conductive Milecules and Polymers", vol. 2, 1997, pp. 534-535.

Oelkrug, D. et al., "Electronic spectra of self-organized oligothiophene films with 'standing' and 'lying' molecular units", Elsevier Science S.A., 1996, Thin Solid Films 284-270.

Qiao, X. et al., "The FeCl3-doped poly3-alkithiophenes) in solid state", Elsevier Science, Synthetic Metals 122 (2001) pp. 449-454.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Roman et al., "Polymer Diodes With High Rectification", Applied Physics Letters, vol. 75, No. 21, Nov. 22, 1999.

Rost, Henning et al., "All-Polymer Organic Field Effect Transistors", Proc. Mat. Week, CD, 2001, pp. 1-6.

Sandberg, H. et al, "Ultra-thin Organic Films for Field Effect Transistors", SPIE vol. 4466, 2001, pp. 35-43.

Schoebel, "Frequency Conversion with Organic-On-Inorganic Heterostructured Diodes", Extended Abstracts of the International Conference on Solid State Devices and Materials, Sep. 1, 1997.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seitenn 91-94.

Shaheen, S.E., et al., "Low band-gap polymeric photovoltaic devices", Synthetic Metals, vol. 121, 2001, pp. 1583-1584.

Speakman, S.P. et al., High performance organic semiconducting thin films: Ink Jet printed polythophene [π-P3HT], Organic Electronics 2 (2), 2001, pp. 65-73.

Takashima, W. et al., Electroplasticity Memory Devices Using Conducting Polymers and Solid Polymer Electrolytes, Polymer International, Melbourne, 1992, pp. 249-253.

Ullman, A. et al., "High Performance Organic Field-Effect Transistors and Integrated Inverters", Mat. Res. Soc. Symp. Proc., v. 665, 2001, pp. 265-270.

Velu, G. et al. "Low Driving Voltages and Memory Effect in Organic Thin-Film Transistors With A Ferroelectric Gate Insulator", Applied Physics Letters, American Institute of Physics, New York, Vo.I 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-octylthiophene)", Macromolecules 1992, vol. 25, pp. 3284-3290.

Yu, G. et al., "Dual-function semiconducting polymer devices: Light-emitting and photodetecting diodes", American Institute of Physics, Applied Physics Letter 64, Mar. 21, 1994, pp. 1540-1542.

Zangara L., "Metall Statt Halbleiter, Programmierung Von Embedded ROMS Ueber Die Metallisierungen", Elektronik, Franzis Verlag GmbH, Munchen, DE, vol. 47, No. 16, Aug. 4, 1998, pp. 52-55.

Zheng, Xiang-Yang et al., "Electrochemical Patterning of the Surface of Insulators with Electrically Conductive Polymers", J. Electrochem. Soc., v. 142, 1995, pp. L226-L227.

Zie Voor Titel Boek, d 2e Pagina,XP-002189001, p. 196-228.

U.S. Appl. No. 10/344,951, Organic Field-Effect Transistor (OFET), A Production Method Therefor, An Integrated Circuit Constructed From the Same and Their Uses, Adolf Bernds et al.

U.S. Appl. No. 10/362,932, Organic Field Effect Transistor, Method for Structuring an OFET and Integrated Circuit, Adolf Bernds et al.

U.S. Appl. No. 10/380,113, Organic Rectifier, Circuit, RFID Tag and Use of an Organic Rectifier, Adolf Bernds et al.

U.S. Appl. No. 10/381,032, Electrode and/or Conductor Track for Organic Components and Production Method Thereof, Adolf Bernds et al.

U.S. Appl. No. 10/433,959, Organic Field Effect Transistor, Method For Structuring an OFET and Integrated Circuit, Adolf Bernds.

U.S. Appl. No. 10/433,961, Device For Detecting and/or Transmitting at Least One Environmental Influence, Method for Producing Said Device and Use Thereof, Wolfgang Clemens et al.

U.S. Appl. No. 10/467,636, Organic Field Effect Transistor With a Photostructured Gate Dielectric, Method for the Production and Use Thereof in Organic Electronics, Adolf Bernds et al.

U.S. Appl. No. 10/473,050, Device With At Least Two Organic Electronic Components and Method for Producing the Same, Adolf Bernds et al.

U.S. Appl. No. 10/479,234, Organic Field Effect Transistor, Method for Production and Use Thereof in the Assembly of Integrated Circuits, Adolf Bernds et al.

U.S. Appl. No. 10/479,238, Method For Producing Conductive Structures by Means of Printing Technique, and Active Components Produced Therefrom For Integrated Circuits, Adolf Bernds et al.

U.S. Appl. No. 10/492,922, Insulator for An Organic Electronic Component, Erwann Guillet et al.

U.S. Appl. No. 10/492,923, Electronic Unit, Circuit Design for the Same and Production Method, Wolfgang Clemens et al.

U.S. Appl. No. 10/498,610, Organic Field Effect Transistor with Offset Threshold Voltage and the Use Thereof, Walter Fix et al.

U.S. Appl. No. 10/508,640, Logic Component Comprising Organic Field Effect Transistors, Walter Fix et al.

U.S. Appl. No. 10/508,737, Device and Method for Laser Structuring Functional Polymers and, Adolf Bernds et al.

U.S. Appl. No. 10/517,750, Substrate for an Organic Field Effect Transistor, Use of the Substrate, Method of Increasing the Charge Carrier Mobility and Organic Field Effect Transistor (OFET), Wolfgang Clemens et al.

U.S. Appl. No. 10/523,216, Electronic Component Comprising Predominantly Organic Functional Materials And A Process For The Production Thereof, Adolf Bernds et al.

U.S. Appl. No. 10/523,487, Electronic Device, Wolfgang Clemens et al.

U.S. Appl. No. 10/524,646, Organic Component for Overvoltage Protection and Associated Circuit, Walter Fix et al.

U.S. Appl. No. 10/533,756, Organic Electronic Component with High-Resolution Structuring and Process for the Production Thereof, Wolfgang Clemens et al.

U.S. Appl. No. 10/534,678, Measuring Apparatus for Determining an Analyte in a Liquid Sample, Wolfgang Clemens et al.

U.S. Appl. No. 10/535,448, Organic Electronic Component Comprising Semi-Conductive Functional Layer and Method for Producing Said Component, Wolfgang Clemens et al.

U.S. Appl. No. 10/535,449, Organic Electronic Component Comprising the Same Organic Material for at Least Two Functional Layers, Adolf Bernds et al.

U.S. Appl. No. 10/344,926, An Electronic Circuit Having an Encapsulated Organic-Electronic Component, and a Method for Making an Encapsulated Organic-Electronic Component, Wolfgang Clemens et al.

U.S. Appl. No. 10/541,815, Organo-Resistive Memory Unit, Axel Gerlt et al.

U.S. Appl. No. 10/541,956, Board or Substrate for an Organic Electronic Device and Use Thereof, Wolfgang Clemens et al.

U.S. Appl. No. 10/541,957, Organic Field Effect Transistor And Integrated Circuit, Walter Fix et al.

U.S. Appl. No. 10/543,561, Organic Storage Component and Corresponding Triggering Circuit, Wolfgang Clemens et al.

U.S. Appl. No. 10/542,678, Organic Electronic Component and Method For Producing Organic Electronic Devices, Adolf Bernds et al.

U.S. Appl. No. 10/542,679, Use of Conductive Carbon Black/Graphite Mixtures for the Production of Low-Cost Electronics, Adolf Bernds et al.

U.S. Appl. No. 10/562,989, Method and Device for Patterning Organic Layers, Jurgen Ficker.

U.S. Appl. No. 10/562,869, Logic Gate With a Potential-Free Gage Electrode for Organic Integrated Circuits, Wolfram Glauert.

U.S. Appl. No. 10/569,763, Organic Electronic Component With High Resolution Structuring And Method For The Production Thereof, Walter Fix.

U.S. Appl. No. 10/568,730, Organic Capacitor With Voltage-Controlled Capacitance, Wolfgang Clemens.

U.S. Appl. No. 10/569,233, Polymer mixtures for printed polymer electronic circuits, Adolf Bernds.

U.S. Appl. No. 10/570,571, Mechanical Control Elements For Organic Polymer Electronic Devices, Wolfgang Clemens.

U.S. Appl. No. 10/344,926, filed Feb. 12, 2004, Adolf Bernds et al.
U.S. Appl. No. 10/344,951, filed Feb. 12, 2004, Adolf Bernds et al.
U.S. Appl. No. 10/380,113, filed Sep. 25, 2003, Adolf Bernds et al.
U.S. Appl. No. 10/381,032, filed Feb. 12, 2004, Adolf Bernds et al.
U.S. Appl. No. 10/433,959, filed Apr. 1, 2004, Adolf Bernds.
U.S. Appl. No. 10/433,961, filed Apr. 1, 2004, Wolfgang Clemens et al.
U.S. Appl. No. 10/451,108, filed May 13, 2004, Mark Giles et al.
U.S. Appl. No. 10/467,636, filed Nov. 4, 2004, Adolf Bernds et al.
U.S. Appl. No. 10/473,050, filed May 20, 2004, Adolf Bernds et al.
U.S. Appl. No. 10/479,234, filed Dec. 30, 2004, Adolf Bernds et al.
U.S. Appl. No. 10/479,238, filed Oct. 20, 2004, Adolf Bernds et al.
U.S. Appl. No. 10/492,922, filed Mar. 3, 2005, Erwann Buillet et al.
U.S. Appl. No. 10/492,923, filed Dec. 23, 2004, Wolfgang Clemens et al.
U.S. Appl. No. 10/498,610, filed Sep. 29, 2005, Walter Fix et al.
U.S. Appl. No. 10/508,640, filed Dec. 15, 2005, Walter Fix et al.
U.S. Appl. No. 10/508,737, filed May 19, 2005, Adolf Bernds et al.
U.S. Appl. No. 10/517,750, filed Oct. 13, 2005, Wolfgang Clemens et al.
U.S. Appl. No. 10/523,216, filed Feb. 2, 2006, Adolf Bernds et al.
U.S. Appl. No. 10/523,487, filed Apr. 13, 2006, Wolfgang Clemens et al.
U.S. Appl. No. 10/524,646, filed May 11, 2006, Walter Fix et al.
U.S. Appl. No. 10/533,756, Wolfgang Clemens et al.
U.S. Appl. No. 10/534,678, Wolfgang Clemens et al.
U.S. Appl. No. 10/535,448, W. Clemens et al.
U.S. Appl. No. 10/535,449, filed Feb. 16, 2006, Walter Fix et al.
U.S. Appl. No. 10/541,815, Axel Gerlt et al.
U.S. Appl. No. 10/541,956, Wolfgang Clemens et al.
U.S. Appl. No. 10/541,957, Walter Fix et al.
U.S. Appl. No. 10/543,561, Wolfgang Clemens et al.
U.S. Appl. No. 10/542,678, Adolf Bernds et al.
U.S. Appl. No. 10/542,679, filed Mar. 16, 2006, Adolf Bernds et al.
U.S. Appl. No. 10/562,989, Jurgen Ficker et al.
U.S. Appl. No. 10/562,869, Wolfram Glauert.
U.S. Appl. No. 10/569,763, Walter Fix et al.
U.S. Appl. No. 10/568,730, Wolfgang Clemens et al.
U.S. Appl. No. 10/569,233, Adolf Bernds et al.
U.S. Appl. No. 10/570,571, Clemens et al.

* cited by examiner

POLYMER MIXTURES FOR PRINTED POLYMER ELECTRONIC CIRCUITS

Plastics (polymers) are known as insulators. However, there are also some remarkable polymers having conductive and even semiconductive properties. All three properties taken together permit the production of fully functioning integrated circuits from polymers. The attraction of polymer electronics lies in its simple producability because the polymers can be deposited from the solution to give layers. This means that in particular it is possible to use inexpensive printing techniques by means of which the individual structured layers of integrated circuits can be produced. However, every printing process sets specific requirements with regard to the substances to be printed, in this case the polymer solutions. It is rare that the properties of the polymer solutions comply with the printing requirements from the outset. Thus, for example, the viscosity of the polymer solutions is considerably too low for most printing processes. This applies in particular to polymeric semiconductor material.

An inkjet technique for printing low-viscosity semiconductor material is known from Nalwa H. S. (editor): "Organic Conductive Molecules and Polymers", volume 2, 1997, pages 334 to 335). Inkjet printing is, however, least favored for mass production.

Starting from this, it is the object of the invention to make semiconductive polymers accessible to standard printing processes.

This object is achieved by the inventions stated in the independent claims. Advantageous developments are evident from the dependent claims.

Accordingly, a polymer mixture, in particular a polymer solution, contains one or more semiconductive polymers and one or more non-semiconductive, i.e. insulating and/or conductive polymers.

Polythiophene, in particular poly(3-hexylthiophene) (P3HT), has proven particularly advantageous as a semiconductive polymer. However, the use of polyfluorene or polythienylenevinylene and a mixture of two or three of said semiconductive polymers is also possible.

Polystyrene (PS), polymethyl methacrylate (PMMA), cymel and polyisobutyl (PIB) or mixtures thereof have proven particularly suitable as non-semiconductive polymers.

In order to obtain a polymer solution, solvents may also be present in the polymer mixture, in particular chloroform, toluene, ketones, dioxane and/or heptane.

In addition, the polymer mixture may contain conductive polymers, oligomers, conductive molecules and/or semiconductive molecules (monomers, "small molecules", in particular pentacene and/or C60), particles and other materials which cannot be dissolved, or may consist of a selection of said substances and possibly customary additives.

By said mixing of semiconductive and non-semiconductive polymers, it is possible to establish the desired viscosity of the polymer solution. Preferably, a viscosity of more than 8 mPa·s is established, in particular more than 80 mPa·s. As a result, the polymer solution is suitable for screen printing or pad printing and further standard printing processes.

A polymer mixture of the type described can preferably be used in a printing process, in particular in a screen printing, flexographic printing, offset printing, gravure printing and/or pad printing process.

By means of a polymer mixture of the type described, it is possible to produce a double layer which contains one or more semiconductive polymers in its first layer and one or more non-semiconductive polymers in its second layer.

This can be effected, for example, in a process for the production of the double layer in which a polymer mixture of the type described is used, which polymer mixture separates on deposition from the solution and thus forms the double layer.

A printed electronic circuit can be produced using a polymer mixture of the type described, it being possible to create semiconductive polymer structures by screen printing and/or pad printing during the production. Alternatively or in addition, the polymer mixture can also be used generally for the production of electrical components, for example for organic transistors, diodes, capacitors, resistors, light emitting diodes, photovoltaic cells, photodetectors, display elements, etc.

Preferred developments of the printing process, of the double layer, of the process for the production of the double layer and of the electronic circuit arise from the preferred developments of the polymer mixture, and vice versa.

Further advantages and features of the invention are evident from the description of working examples with reference to the drawing.

It is proposed to mix the functional, i.e. semiconductive polymers with other polymers in order in this manner to achieve an adaptation to a wide range of printing requirements. The mixing of polymers (polymer blends) is a customary method for obtaining certain combinations of properties. However, in the case of the semiconductor polymers, such mixtures have not yet been considered. If such a mixture were to be considered theoretically, virtually complete disappearance of the semiconductive properties would be expected for semiconductor polymers as a result of addition of other materials. However, our own experiments show that this is not the case.

Polythiophene, as a semiconductive polymer, was mixed with polystyrene and polymethyl methacrylate. It is found that the semiconductor function is retained in the mixed polymer system too. At the same time, the corresponding polymer solution has an increased viscosity, which makes it more readily printable.

The reason why the semiconductive properties are so well retained is not exactly known, but two arguments appear possible. Firstly, polyaniline is a conductive polymer. Like polythiophene, it belongs to the class of the conjugated polymers. In polymer mixtures, it retains its conductive function to a high degree, as described in Speakman S. P. et al.: "Organic Electronics 2 (2)", 2001, pages 65 to 73. What is true here for polyaniline may apparently also be applied to polythiophene. Secondly, it is a known phenomenon that polymer mixtures tend to separate after deposition from solution. This is described, for example, in Garbassi F. et al.: "Polymer Surfaces", 1998, pages 289 to 300. The polymer system minimizes its total energy by virtue of the fact that the material having the lower surface energy forms the uppermost layer.

In our case, two layers form, the first of which substantially comprises the admixed polymer (PS or PMMA). The second layer is a virtually pure polythiophene layer. It imparts the semiconductor property to the system. What has been demonstrated here for polythiophene by way of example is also possible with other semiconductive polymers, for example polyfluorene and polythienylenevinylene.

Figure 1:
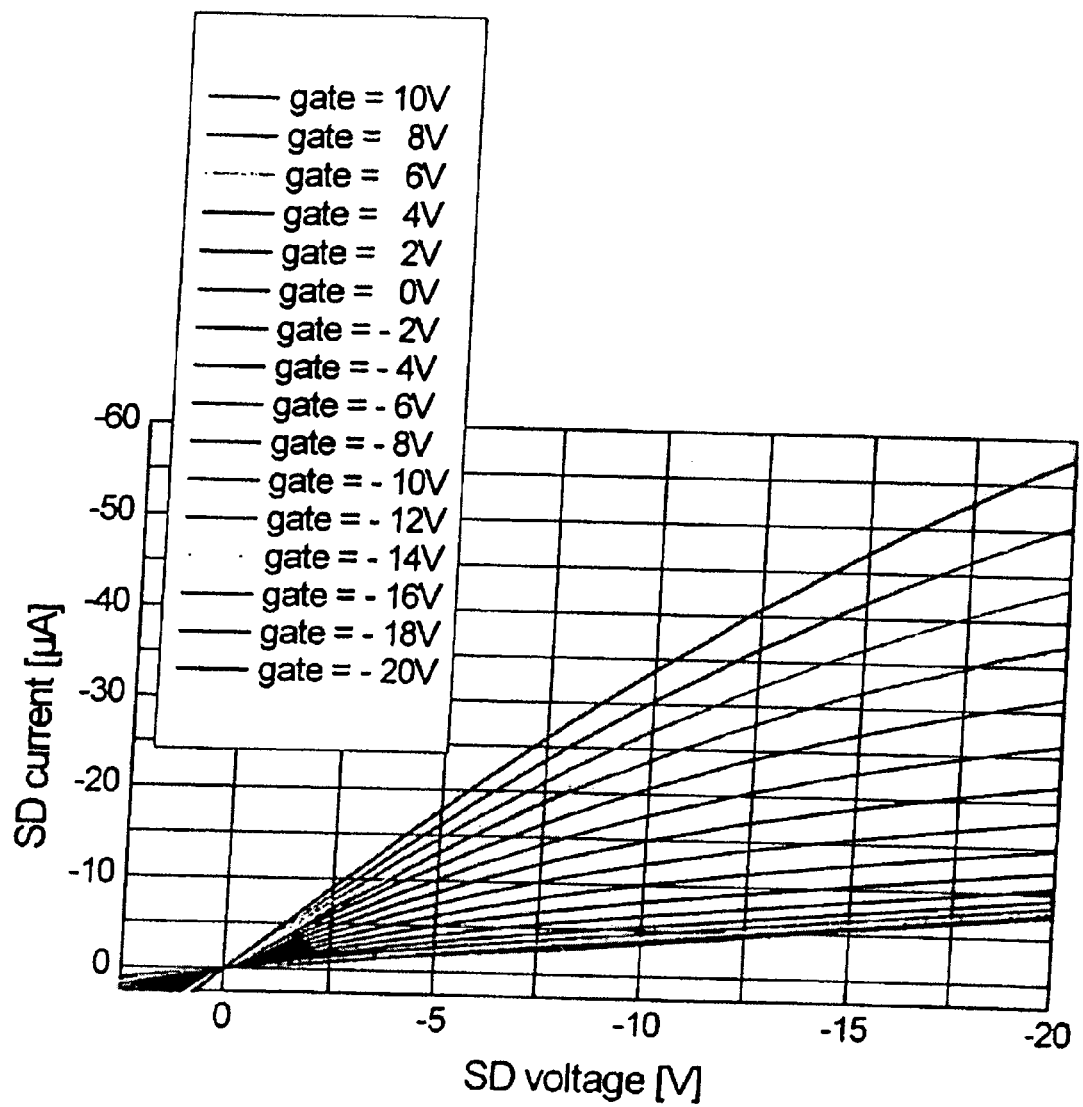
FIG. 1 shows the characteristic of an organic field effect transistor having a semiconductive layer which consists purely of semiconductive polymer.
Figure 2:
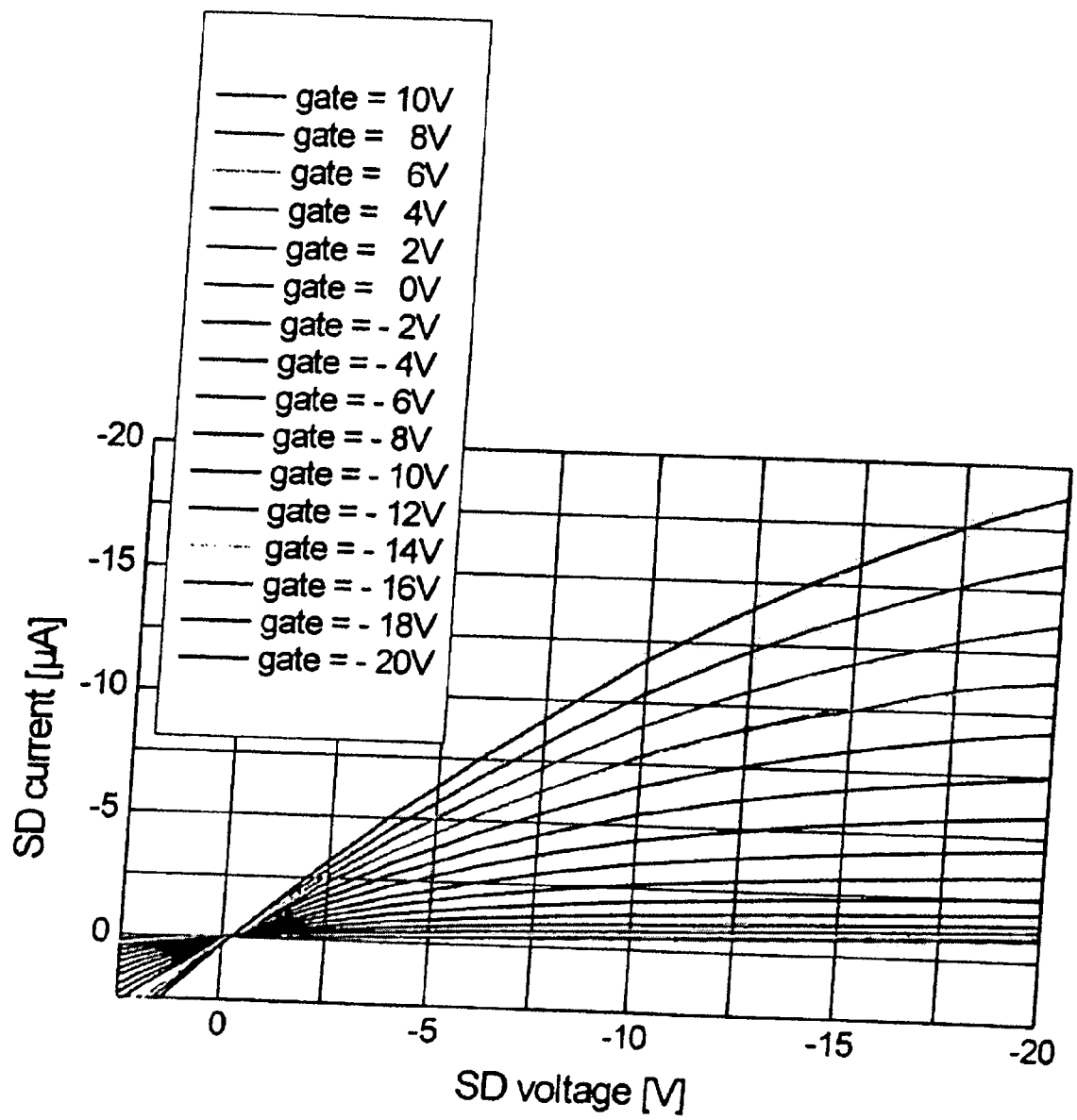
FIG. 2 shows the characteristic of an organic field effect transistor having a semiconductive layer which consists of non-semiconductive polymer and semiconductive polymer in the weight ratio 1:3.
Figure 3:
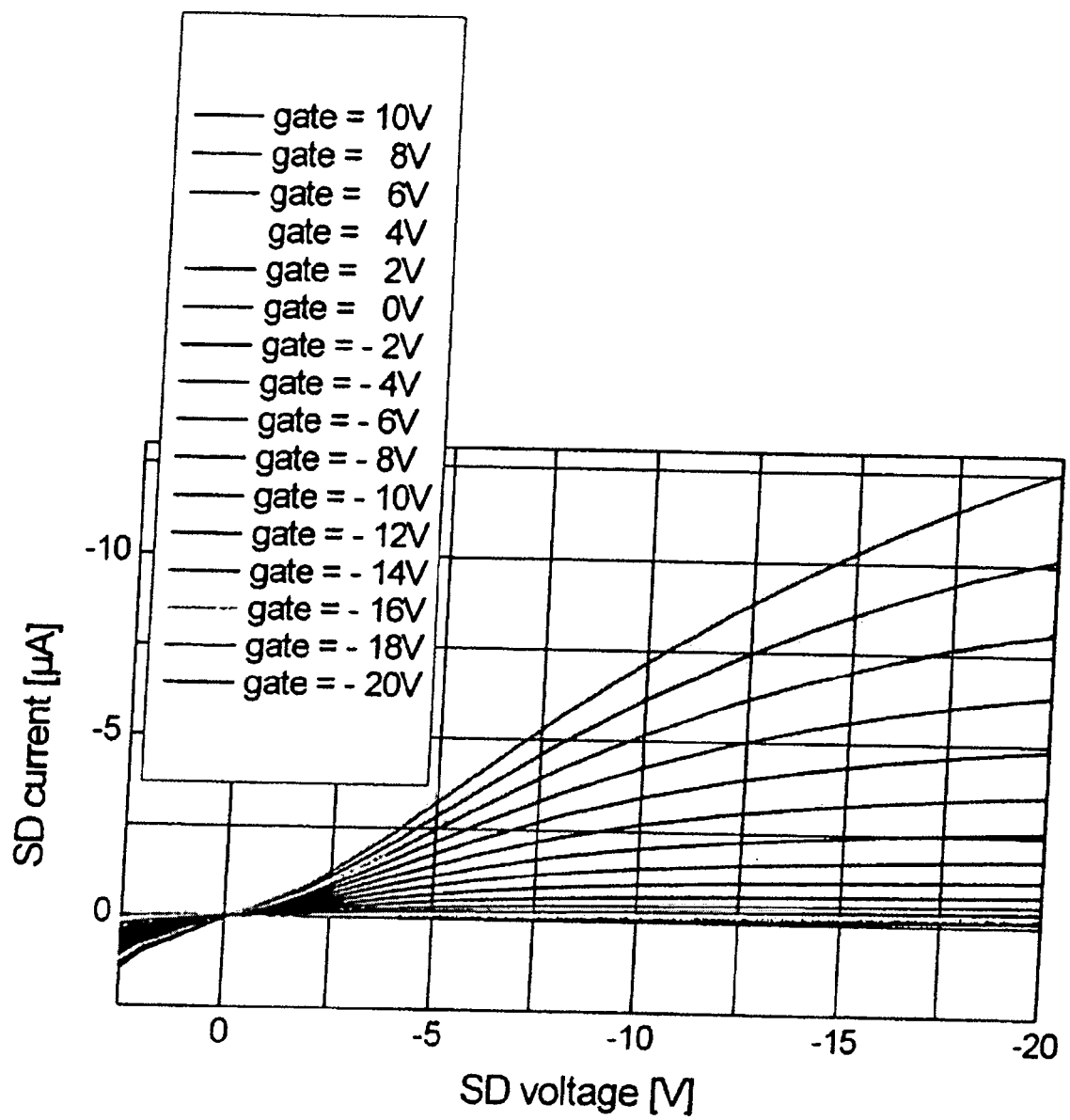
FIG. 3 shows the characteristic of an organic field effect transistor having a semiconductive layer which consists of non-semiconductive and semiconductive polymer in the weight ratio 1:1.

FIGS. 1 to 3 show the characteristics of three organic field effect transistors (OFETs) having different mass ratios of polystyrene (PS) and poly(3-hexylthiophene) (P3HT) in the semiconductive layer. In FIG. 1, the ratio of PS to P3HT is 0:100, in FIG. 2 the ratio of PS to P3HT is 25:75 and in FIG. 3 the ratio of PS to P3HT is 50:50. The layer thicknesses are unchanged for better comparison.

The OFETs comprising PS and P3HT, whose, characteristics are shown in FIGS. 2 and 3, function just as well as the OFET comprising P3HT, whose characteristics are shown in FIG. 1, except that the current decreases with increasing proportion of PS. Since, however, the OFF current decreases more sharply than the ON current, the transistor characteristic of the ON/OFF ratio even improves.

A further tested working example is the system P3HT and polyisobutyl (PIB). At maximum solubility of 2.5% of polymer solid in chloroform, P3HT has a viscosity of 2 mPa·s. By adding PIB dissolved in heptane the viscosity can be increased to values up to 100 mPa·s, depending on the mixing ratio. This meets the requirements of screen printing, in which the viscosity must be greater than or equal to 10 mPa·s, and of pad printing, in which the viscosity must be greater than or equal to 100 mPa·s. In experiments, operable OFETs have also been produced with this semiconductor mixture.

By means of the invention, the properties of different polymers are combined with one another. For example, polythiophene contributes the semiconductive property and polystyrene the higher viscosity in the polymer solution. Polythiophene alone in solution would not be readily printable owing to the excessively low viscosity, whereas the addition of polystyrene imparts higher viscosity to the solution, which makes it more readily printable. Further advantages are to be seen for the case of the abovementioned separation. They relate to the solid double layer, for example of insulator and semiconductor, remaining behind after evaporation of the solvent. Specifically, the advantages are as follows:

saving of an operation by simultaneous production of the two layers, production of an extremely thin semiconductor layer, which is not possible by direct printing of only the semiconductor solution, perfect bonding (adhesion) of the two layers to one another, the layers rest on one another in exact register, particularly in printed structures (self-alignment), the solvent compatibility does not play a role, i.e. there is no partial dissolution of the lower layer on application of the upper layer, it is to be expected that the special method of layer formation by separation has a positive influence on the layer quality, for example with regard to low defect density and high structural order of the (conjugated) polymers.

The invention claimed is:

1. A printable polymer mixture for the preparation of a double layer comprising a semiconductor layer and a non-semiconductive layer wherein the mixture exhibits semiconductive properties, the mixture comprising:
   one or more semiconductive polymers; and
   one or more non-semiconductive polymers,
   in a solution comprising a non-electrolytic solvent to form said printable mixture and said double layer.

2. The polymer mixture as claimed in claim 1 wherein the semiconductive polymers include at least one of the group consisting of polythiophene, polyfluorene or polythienylenevinylene.

3. The polymer mixture as claimed in claim 1 wherein the non-semiconductive polymers are selected from the group consisting of at least one of polystyrene, polymethyl methacrylate, cymel or poly isobutyl.

4. The polymer mixture as claimed in claim 1 wherein said solvent includes at least one of chloroform, toluene, ketones, dioxane or heptane.

5. The polymer mixture as claimed in claim 1 wherein the mixture it additionally contains molecules which are smaller than polymers, in particular oligomers, conductive molecules or semiconductive molecules.

6. The polymer mixture as claimed in claim 1 wherein the mixture further includes additives.

7. The polymer mixture as claimed in claim 1 wherein the mixture has a viscosity of more than 8 mpa·s.

8. A printing process for the production of a semiconductive double layer by a known process, selected from the group consisting of at least one of screen printing, flexographic printing, offset printing, gravure printing and/or pad printing process, the polymer mixture as claimed in claim 1 being used as a print medium in the known process.

9. A printing process for the production of a semiconductive double layer by a known process, selected from the group consisting of screen printing, flexographic printing, offset printing, gravure printing and/or pad printing process, the double layer produced by printing a printing medium comprising the polymer mixture of claim 1 for forming
   the one or more semiconductive polymers in a first of its layers, and
   the one or more non-semiconductive polymers in a second of its layers.

10. An electronic component which is produced using a polymer mixture as claimed in claim 1.

11. An electronic component which is produced using a polymer mixture that forms a double layer as claimed in claim 9.

12. An electronic component which is produced using a polymer mixture as claimed in claim 2.

13. An electronic component which is produced using a polymer mixture as claimed in claim 3.

14. An electronic component which is produced using a polymer mixture as claimed in claim 4.

15. An electronic component which is produced using a polymer mixture as claimed in claim 5.

16. An electronic component which is produced using a polymer mixture as claimed in claim 6.

17. An electronic component which is produced using a polymer mixture as claimed in claim 7.

18. A printing process for the production of a semiconductive double layer by a known process, selected from the group consisting of screen printing, flexographic printing, offset printing, gravure printing and/or pad printing process, the double layer produced by printing a printing medium comprising the polymer mixture of claim 2 for forming
   the one or more semiconductive polymers in a first of its layers, and
   the one or more non-semiconductive polymers in a second of its layers.

19. A printing process for the production of a semiconductive double layer by a known process, selected from the group consisting of screen printing, flexographic printing, offset printing, gravure printing and/or pad printing process, the double layer produced by printing a printing medium comprising the polymer mixture of claim 3 for forming
- the one or more semiconductive polymers in a first of its layers, and
- the one or more non-semiconductive polymers in a second of its layers.

20. An electronic component comprising:
a substrate; and on the substrate:
a polymer mixture, the polymer mixture comprising first and second materials having respective semiconductive and non-semiconductive properties, the mixture comprising:
- one or more semiconductive polymers, and
- one or more non-semiconductive polymers, wherein the semiconductive and non-semiconductive polymers separate from one another after deposition on the substrate forming separate and discrete semiconductor and non-semiconductor layers on the substrate.

* * * * *